US008689083B2

(12) United States Patent
Nguyen et al.

(10) Patent No.: US 8,689,083 B2
(45) Date of Patent: Apr. 1, 2014

(54) RATE-COMPATIBLE PROTOGRAPH LDPC CODES

(75) Inventors: Thuy V. Nguyen, Dallas, TX (US); Aria Nosratinia, Plano, TX (US); Dariush Divsalar, Pacific Palisades, CA (US)

(73) Assignees: California Institute of Technology, Pasadena, CA (US); Board of Regents, The University of Texas System, Austin, TX (US)

( * ) Notice: Subject to any disclaimer, the term of this patent is extended or adjusted under 35 U.S.C. 154(b) by 304 days.

(21) Appl. No.: 13/158,263

(22) Filed: Jun. 10, 2011

(65) Prior Publication Data

US 2011/0307756 A1 Dec. 15, 2011

Related U.S. Application Data

(60) Provisional application No. 61/355,050, filed on Jun. 15, 2010.

(51) Int. Cl.
*H03M 13/00* (2006.01)

(52) U.S. Cl.
USPC .......................................... 714/774; 714/781

(58) Field of Classification Search
None
See application file for complete search history.

(56) References Cited

U.S. PATENT DOCUMENTS

| 6,633,856 | B2 | 10/2003 | Richardson et al. | |
|---|---|---|---|---|
| 7,095,792 | B2 * | 8/2006 | Doetsch et al. | 375/265 |
| 7,343,539 | B2 | 3/2008 | Divsalar et al. | |
| 7,499,490 | B2 | 3/2009 | Divsalar et al. | |
| 8,117,523 | B2 * | 2/2012 | Divsalar et al. | 714/801 |
| 8,239,746 | B2 * | 8/2012 | Divsalar et al. | 714/801 |
| 8,495,450 | B2 * | 7/2013 | Abu-Surra et al. | 714/752 |
| 8,560,911 | B2 * | 10/2013 | Abu-Surra et al. | 714/752 |
| 2006/0291571 | A1 | 12/2006 | Divsalar et al. | |
| 2006/0294445 | A1 | 12/2006 | Divsalar et al. | |
| 2007/0162815 | A1 * | 7/2007 | El-Khamy et al. | 714/752 |
| 2007/0283216 | A1 * | 12/2007 | Kyung et al. | 714/758 |
| 2008/0059862 | A1 * | 3/2008 | Kyung et al. | 714/752 |
| 2008/0222486 | A1 * | 9/2008 | Richardson et al. | 714/757 |
| 2008/0294969 | A1 | 11/2008 | Divsalar et al. | |
| 2009/0001933 | A1 | 1/2009 | Fu | |
| 2009/0019333 | A1 | 1/2009 | McEvoy et al. | |

(Continued)

FOREIGN PATENT DOCUMENTS

| JP | 2009-044732 | 2/2009 |
|---|---|---|
| JP | 2009-44732 | 2/2009 |

OTHER PUBLICATIONS

Hu, X., Eleftheriou, E. and Arnold, D.M., "Regular and irregular progressive edge-growth tanner graphs," *IEEE Transactions on Information Theory*, vol. 51, No. 1, pp. 386-398 (Jan. 2005).

(Continued)

*Primary Examiner* — Daniel McMahon
(74) *Attorney, Agent, or Firm* — Steinfl & Bruno, LLP

(57) ABSTRACT

Digital communication coding methods resulting in rate-compatible low density parity-check (LDPC) codes built from protographs. Described digital coding methods start with a desired code rate and a selection of the numbers of variable nodes and check nodes to be used in the protograph. Constraints are set to satisfy a linear minimum distance growth property for the protograph. All possible edges in the graph are searched for the minimum iterative decoding threshold and the protograph with the lowest iterative decoding threshold is selected. Protographs designed in this manner are used in decode and forward relay channels.

27 Claims, 8 Drawing Sheets

THRESHOLD OF THE NEW PROTOGRAPH CODE FAMILY

| Code Rate | Protograph threshold (dB) | Capacity threshold (dB) | Gap to capacity |
|---|---|---|---|
| 1/2 | 0.395 | 0.187 | 0.208 |
| 2/3 | 1.181 | 1.059 | 0.122 |
| 3/4 | 1.701 | 1.626 | 0.075 |
| 4/5 | 2.112 | 2.040 | 0.062 |
| 5/6 | 2.445 | 2.362 | 0.083 |
| 6/7 | 2.702 | 2.625 | 0.077 |
| 7/8 | 2.930 | 2.845 | 0.085 |
| 8/9 | 3.123 | 3.042 | 0.081 |
| 9/10 | 3.288 | 3.199 | 0.089 |

(56) References Cited

U.S. PATENT DOCUMENTS

| | | | |
|---|---|---|---|
| 2010/0023834 A1* | 1/2010 | Richardson et al. | 714/751 |
| 2010/0169736 A1 | 7/2010 | Garani et al. | |
| 2010/0192047 A1 | 7/2010 | Murakami et al. | |
| 2010/0257425 A1 | 10/2010 | Yue et al. | |
| 2011/0047433 A1 | 2/2011 | Abu-Surra et al. | |
| 2011/0066916 A1 | 3/2011 | Abu-Surra et al. | |
| 2012/0131409 A1* | 5/2012 | Divsalar et al. | 714/752 |

OTHER PUBLICATIONS

Tian, T., Jones, C.R., Villasenor, J.D. and Wesel, R.D., "Selective avoidance of cycles in irregular LDPC code construction," IEEE Transactions on Communications, vol. 52, No. 8, pp. 1242-1247 (Aug. 2004).

Tian, T., Jones, C.R., Villasenor, J.D. and Wesel, R.D., "Construction of irregular LDPC codes with low error floors," IEEE International Conference on Communications, vol. 5, pp. 3125-3129 (2003).

Abu-Surra, S., Divsalar, D. and Ryan, W., "On the existence of typical minimum distance for protograph based LDPC codes," Information Theory and Applications Workshop (ITA), pp. 1-7 (Jan. 2010).

Divsalar, D., Dolinar, S., Jones, C. R. and Andrews, K., "Capacity approaching protograph codes," IEEE J. Select. Areas Communication, vol. 27, No. 6, pp. 876-888 (Aug. 2009).

Liva, G. and Chiani, M., "Protograph LDPC codes design based on EXIT analysis," in Proc. IEEE GLOBECOM, pp. 3250-3254 (Nov. 2007).

Jacobsen, N. and Soni, R., "Design of rate-compatible irregular LDPC codes based on edge growth and parity splitting," in Proc. IEEE Vehicular Technology Conference (VTC), 2007, pp. 1052-1056 (Oct. 2007).

El-Khamy, M., Hou, J. and Bhushan, N., "Design of rate-compatible structured LDPC codes for hybrid ARQ applications," IEEE J. Select. Areas Commun., vol. 27, No. 6, pp. 965-973 (Aug. 2009).

Dolinar, S., "A rate-compatible family of protograph-based LDPC codes built by expurgation and lengthening," Proc. IEEE ISIT, pp. 1-5 (Sep. 2005).

Richardson, T. and Urbanke, R., "Multi-edge type LDPC codes," Tech. Rep., pp. 1-36 (Apr. 2004).

Abbasfar, A., Divsalar, D. and Yao, K., "Accumulate-repeat-accumulate codes," IEEE Trans. Commun., vol. 55, No. 4, pp. 692-702 (Apr. 2007).

Li, J. and Narayanan, K. R., "Rate-compatible low density parity check codes for capacity-approaching ARQ schemes in packet data communications," Proc. CIIT, pp. 1-6 (Nov. 2002).

Yazdani, M. R. and Banihashemi, A. H., "On construction of rate compatible low-density parity-check codes," IEEE Commun. Lett., vol. 8, No. 3, pp. 159-161 (Mar. 2004).

Ha, J., Kim, J., and McLaughlin, S., "Rate-compatible puncturing of low density parity-check codes," IEEE Trans. Inform. Theory, vol. 50, No. 11, pp. 2824-2836 (Nov. 2004).

Pishro-Nik H. and Fekri, F., "Results on punctured LDPC codes," Proc. IEEE Information Theory Workshop, pp. 215-219 (Oct. 2004).

Sendonaris, A., Erkip, E. and Aazhang, B., "User cooperation diversity. Part I: System Description," IEEE Trans. Commun., vol. 51, No. 11, pp. 1927-1938 (Nov. 2003).

Sendonaris, A., Erkip, E. and Aazhang, B., "User cooperation diversity. Part II. Implementation aspects and performance analysis," IEEE Trans. Commun., vol. 51, No. 11, pp. 1939-1948 (Nov. 2003).

Hunter, T. and Nosratinia, A. "Cooperation diversity through coding," Proc. IEEE ISIT, p. 220 (Jun. 2002).

Laneman, J., Tse, D. and Wornell, G., "Cooperative diversity in wireless networks: Efficient protocols and outage behavior," IEEE Trans. Inform. Theory, vol. 50, No. 12, pp. 3062-3080 (Dec. 2004).

Laneman, J. and Wornell, G., "Distributed space-time-coded protocols for exploiting cooperative diversity in wireless networks," IEEE Transactions on Information Theory, vol. 49, No. 10, pp. 2415-2425 (Oct. 2003).

Cover, T. and Gamal, A. E., "Capacity theorems for the relay channel," IEEE Trans. Inform. Theory, vol. 25, No. 5, pp. 572-584 (Sep. 1979).

Kramer, G., Gastpar, M. and Gupta, P., "Cooperative strategies and capacity theorems for relay networks," IEEE Trans. Inform. Theory, vol. 51, No. 9, pp. 3037-3063 (Sep. 2005).

Razaghi, P. and Yu, W., "Bilayer low-density parity-check codes for decode-and-forward in relay channels," IEEE Trans. Inform. Theory, vol. 53, No. 10, pp. 3723-3739 (Oct. 2007).

Xie, L.L. and Kumar, P.R., "An achievable rate for the multiple level relay channel," IEEE Trans. Information Theory, vol. 51, No. 4, pp. 1348-1358 (Apr. 2005).

PCT International Search Report (ISR) mailed on Apr. 18, 2012 for PCT Application No. PCT/US2011/040095 filed Jun. 10, 2011 in the name of California Institute of Technology et al.

PCT Written Opinion mailed on Apr. 18, 2012 for PCT Application No. PCT/US2011/040095 filed Jun. 10, 2011 in the name of California Institute of Technology et al.

Nguyen, T., et al., The Design of Rate-Compatible Protograph LDPC Codes, IEEE 2010, 48th Annual Allerton Conference, Sep. 29-Oct. 1, 2010, 1-5.

ten Brink, S., Convergence Behavior of Iteratively Decode Parallel Concatenated Codes, IEEE Transactions on Communications 2001, 49: 1727-1737.

Divsalar, D., et al., Protograph based low error floor LDPC coded modulation, IEEE MILCOM 2005, 1: 1-8.

Divsalar, D., et al., Low-rate LDPC codes with simple protograph structure, Proc. IEEE ISIT 2005, 1-5.

Nguyen, T., et al., Bilayer Protograph Codes for Half-Duplex Relay Channels, IEEE 2010, Austin, Texas, Jun. 13-18, 2010, 948-952.

Thorpe, J., Low-Density Parity-Check (LDPC) Codes Constructed from Protographs, IPN Progress Report 2003, 1-7.

Thorpe, J., et al., Methodologies for Designing LDPC Codes Using Protographs and Circulants, IEEE 2004, Chicago, Illinois, Jun. 27-Jul. 2, 2004, 236.

Tian, T., et al., Construction of Rate-Compatible LDPC Codes Utilizing Information Shortening and Parity Puncturing, EURASIP Journal on Wireless Communications and Networking 2005, 5, 789-795.

Hsu, C.-H., et al., Capacity achieving LDPC codes through puncturing, IEEE Transactions on Information Theory, vol. 54, No. 10, Oct. 2008, 4698-4706.

Richardson, T. J., et al., Design of capacity-approaching irregular low-density parity-check codes, IEEE Trans. Inform. Theory, Feb. 2001, vol. 47, No. 2, 619-637.

Nguyen, T., et al., Threshold of Protograph-based LDPC Coded BICM for Rayleigh Fading, IEEE Globecom 2011, Dec. 5-Dec. 9, 2011, 1-5.

A. Abbasfar et al., "Accumulate repeat accumulate codes," Proc. IEEE Intern. Symp. on Inform. Theory (ISIT), Jun. 2004, p. 509-513.

A. Ashikhmin et al., "Extrinsic information transfer functions: model and erasure channel properties," IEEE Trans. Inform. Theory, 2004, vol. 50, No. 11, pp. 2657-2673.

S.Y. Chung et al., "Analysis of sum-product decoding of low-density parity-check codes using a Gaussian approximation," IEEE Trans. Inform. Theory, 2001, pp. 657-670.

D. Divsalar et al., "Constructing LDPC codes from simple loop-free encoding modules," 2005 IEEE International Conference on Communications, pp. 658-662.

M. El-Khamy et al., "H-ARQ rate-compatible structured LDPC codes," Proc. IEEE Intern. Symp. on Inform. Theory (ISIT), Jul. 2006, pp. 1134-1138.

M. Good et al., "Incremental redundancy via check splitting," Proc. 23rd Biennial Symp. on Commun.,IEEE, May 2006, pp. 55-58.

J. Ha et al., "Rate-compatible punctured low-density parity-check codes with short block lengths," IEEE Trans. Inform. Theory, Feb. 2006, vol. 52, pp. 728-738.

H. Jin et al., "Irregular repeat-accumulate codes," Proc. Intern. Symp. on Turbo Codes and Related Topics, Sep. 2000, pp. 1-8.

J.S. Lee et al., "A scalable architecture of a structured LDPC decoder," International Symposium of Information Theory, Jun. 2004, ISIT 2004, p. 293.

(56) References Cited

OTHER PUBLICATIONS

M. Luby et al., "Improved low-density parity-check codes using irregular graphs," IEEE Trans. Inform. Theory, Feb. 2001, vol. 47, No. 2, pp. 585-598.
A. Orlitsky et al., "Stopping sets and the girth of Tanner graphs," 2002 IEEE International Symposium on Information Theory, 2002.
T. Richardson et al., "The capacity of low-density parity-check codes under message-passing decoding," IEEE Trans. Inform. Theory, Feb. 2001, vol. 47, No. 2, pp. 599-618.
A. Shokrollahi et al., "Raptor codes," Proceedings 2004 IEEE International Symposium on Information Theory (ISIT2004), Chicago, IL, USA, 2004.
A. Shokrollahi, "Raptor codes," IEEE Trans. Inform. Theory, Jun. 2006, vol. 52, No. 6, pp. 2551-2567.
E. Soljanin et al., "Incremental redundancy hybrid ARQ with LDPC and raptor codes," IEEE Trans. Inform. Theory, Sep. 2005, submitted for publication.
S. Ten Brink et al., "Design of low-density parity-check codes for modulation and detection," IEEE Trans. Commun., 2004, vol. 52, No. 4, pp. 670-678.
M. Tüchler et al., "EXIT charts of irregular codes," Proc. Conf. on Inform. Sciences and Systems (CISS), Mar. 2002, Princeton University, NJ, USA, pp. 1-6.
H. Xiao et al., "Improved progressive-edge-growth (PEG) construction of irregular LDPC codes," IEEE Commun. Lett., Dec. 2004, pp. 715-717.
PCT International Search Report mailed Aug. 29, 2012 for PCT/US2011/062382 filed on Nov. 29, 2011 in the name of California Institute of Technology.
PCT Written Opinion mailed Aug. 29, 2012 for PCT/US2011/062382 filed on Nov. 29, 2011 in the name of California Institute of Technology.
US Non-Final Office Action mailed Aug. 27, 2013 for U.S. Appl. No. 13/306,316, filed Nov. 29, 2011 in the name of California Institute of Technology & Board of Regents, The University of Texas System.
PCT International Search Report mailed Apr. 18, 2012 for PCT/US2011/040095 filed on Jun. 10, 2011 in the name of California Institute of Technology & Board of Regents, The University of Texas System.
PCT Written Opinion mailed Apr. 18, 2012 for PCT/US2011/040095 filed on Jun. 0, 2011 in the name of California Institute of Technology & Board of Regents, The University of Texas System.

* cited by examiner $$H'_{2/3} = \left( H'_{1/2} \middle| \begin{array}{ccc} 0 & 1 & 1 \\ 1 & 0 & 1 \\ 2 & 2 & 2 \\ 0 & 1 & 0 \end{array} \right)_{4 \times 10}$$

$$H'_{3/4} = \left( H'_{2/3} \middle| \begin{array}{ccc} 0 & 0 & 1 \\ 1 & 2 & 0 \\ 2 & 1 & 2 \\ 0 & 0 & 2 \end{array} \right)_{4 \times 13}$$

$$H'_{4/5} = \left( H'_{3/4} \middle| \begin{array}{ccc} 0 & 1 & 2 \\ 1 & 1 & 2 \\ 2 & 2 & 1 \\ 0 & 0 & 0 \end{array} \right)_{4 \times 16}$$

$$H'_{5/6} = \left( H'_{4/5} \middle| \begin{array}{ccc} 0 & 0 & 0 \\ 0 & 2 & 2 \\ 2 & 1 & 1 \\ 2 & 0 & 0 \end{array} \right)_{4 \times 19}$$

$$H'_{6/7} = \left( H'_{5/6} \begin{array}{|ccc} 0 & 1 & 2 \\ 1 & 1 & 2 \\ 2 & 2 & 2 \\ 0 & 0 & 0 \end{array} \right)_{4 \times 22}$$

$$H'_{7/8} = \left( H'_{6/5} \begin{array}{|ccc} 0 & 0 & 1 \\ 2 & 2 & 0 \\ 1 & 2 & 1 \\ 0 & 0 & 2 \end{array} \right)_{4 \times 25}$$

$$H'_{8/9} = \left( H'_{7/8} \begin{array}{|ccc} 0 & 0 & 1 \\ 1 & 2 & 1 \\ 2 & 1 & 2 \\ 0 & 1 & 0 \end{array} \right)_{4 \times 28}$$

$$H'_{9/10} = \left( H'_{8/9} \begin{array}{|ccc} 0 & 0 & 2 \\ 2 & 2 & 0 \\ 1 & 1 & 2 \\ 0 & 0 & 2 \end{array} \right)_{4 \times 31}$$

FIG. 6

THRESHOLD OF THE NEW PROTOGRAPH CODE FAMILY

| Code Rate | Protograph threshold (dB) | Capacity threshold (dB) | Gap to capacity |
|---|---|---|---|
| 1/2 | 0.395 | 0.187 | 0.208 |
| 2/3 | 1.181 | 1.059 | 0.122 |
| 3/4 | 1.701 | 1.626 | 0.075 |
| 4/5 | 2.112 | 2.040 | 0.062 |
| 5/6 | 2.445 | 2.362 | 0.083 |
| 6/7 | 2.702 | 2.625 | 0.077 |
| 7/8 | 2.930 | 2.845 | 0.085 |
| 8/9 | 3.123 | 3.042 | 0.081 |
| 9/10 | 3.288 | 3.199 | 0.089 |

FIG. 7

THRESHOLD OF RATE-COMPATIBLE PROTOGRAPH CODE FAMILY FOR HARQ APPLICATIONS

| Code Rate | Protograph threshold (dB) | Capacity threshold (dB) | Gap to capacity |
|---|---|---|---|
| 3/4 | 1.701 | 1.626 | 0.075 |
| 0.6 | 0.682 | 0.778 | 0.096 |
| 1/2 | 0.285 | 0.187 | 0.098 |
| 0.45 | 0.061 | -0.030 | 0.091 |
| 0.375 | -0.261 | -0.330 | 0.091 |

$$H^1_{0.6} = \left( \begin{array}{ccccccccccccc|ccc} \multicolumn{13}{c|}{\multirow{4}{*}{$H^1_{3/4}$}} & 0 & 0 & 0 \\ & & & & & & & & & & & & & 0 & 0 & 0 \\ & & & & & & & & & & & & & 0 & 0 & 0 \\ & & & & & & & & & & & & & 0 & 0 & 0 \\ \hline 0 & 0 & 2 & 0 & 0 & 1 & 0 & 0 & 0 & 0 & 0 & 1 & 0 & 1 & 0 & 0 \\ 0 & 0 & 1 & 0 & 0 & 1 & 0 & 0 & 0 & 1 & 1 & 1 & 1 & 1 & 0 \\ 0 & 0 & 2 & 1 & 0 & 0 & 0 & 0 & 1 & 0 & 1 & 0 & 0 & 1 & 1 & 1 \end{array} \right)_{7 \times 16}$$

$$H^1_{0.5} = \left( \begin{array}{c|ccc} \multirow{7}{*}{$H^1_{0.6}$} & 0 & 0 & 0 \\ & 0 & 0 & 0 \\ & 0 & 0 & 0 \\ & 0 & 0 & 0 \\ & 0 & 0 & 0 \\ & 0 & 0 & 0 \\ & 0 & 0 & 0 \\ \hline 0\;0\;2\;0\;0\;0\;0\;0\;0\;0\;0\;0\;1\;0\;0 & 1 & 0 & 0 \\ 0\;0\;2\;0\;1\;1\;0\;0\;0\;0\;0\;1\;1\;1\;1 & 1 & 1 & 0 \\ 0\;0\;2\;0\;1\;0\;0\;0\;1\;0\;1\;0\;1\;1 & 0 & 0 & 1 \end{array} \right)_{10 \times 19}$$

$$H^1_{0.45} = \left( \begin{array}{c|cc} \multirow{8}{*}{$H^1_{0.5}$} & 0 & 0 \\ & 0 & 0 \\ & 0 & 0 \\ & 0 & 0 \\ & 0 & 0 \\ & 0 & 0 \\ & 0 & 0 \\ & 0 & 0 \\ \hline 0\;0\;2\;0\;0\;1\;0\;1\;1\;0\;0\;1\;0\;0\;0\;0\;0 & 1 & 0 \\ 0\;0\;2\;0\;1\;0\;0\;0\;0\;0\;1\;0\;0\;0\;0\;0 & 0 & 1 \end{array} \right)_{10 \times 19}$$

$$H^1_{0.375} = \left( \begin{array}{c|cc} \multirow{10}{*}{$H^1_{0.45}$} & 0 & 0 \\ & 0 & 0 \\ & 0 & 0 \\ & 0 & 0 \\ & 0 & 0 \\ & 0 & 0 \\ & 0 & 0 \\ & 0 & 0 \\ & 0 & 0 \\ & 0 & 0 \\ \hline 0\;0\;2\;0\;0\;0\;0\;1\;0\;0\;0\;1\;0\;0\;0\;0\;0\;0\;0 & 1 & 0 \\ 0\;0\;3\;1\;0\;0\;1\;0\;0\;0\;0\;1\;0\;0\;0\;0\;0\;0\;0 & 0 & 1 \end{array} \right)_{12 \times 21}$$

FIG. 9

$$H_{2/3} = \left( \begin{array}{cccccccccccc} & & & & & H'_{3/4} & & & & & & \\ \hline 0 & 2 & 0 & 0 & 0 & 0 & 0 & 0 & 0 & 0 & 2 & 1 & 1 \end{array} \right)$$

$$H_{0.583} = \left( \begin{array}{cccccccccccc} & & & & & H'_{2/3} & & & & & & \\ \hline 0 & 1 & 1 & 0 & 0 & 0 & 1 & 0 & 0 & 0 & 1 & 0 & 0 \end{array} \right)$$

$$H_{1/2} = \left( \begin{array}{cccccccccccc} & & & & & H'_{0.583} & & & & & & \\ \hline 0 & 2 & 1 & 0 & 0 & 0 & 1 & 0 & 0 & 0 & 0 \end{array} \right)$$

$$H_{0.42} = \left( \begin{array}{cccccccccccc} & & & & & H'_{1/2} & & & & & & \\ \hline 0 & 2 & 2 & 0 & 0 & 0 & 0 & 0 & 1 & 0 & 0 \end{array} \right)$$

$$H_{1/3} = \left( \begin{array}{cccccccccccc} & & & & & H'_{0.42} & & & & & & \\ \hline 0 & 2 & 2 & 0 & 0 & 0 & 0 & 0 & 1 & 0 & 0 \end{array} \right)$$

FIG. 11

| Code Rate | Protograph threshold (dB) | Capacity threshold (dB) | Gap to capacity |
|---|---|---|---|
| 3/4 | 1.701 | 1.626 | 0.075 |
| 2/3 | 1.157 | 1.059 | 0.098 |
| 0.583 | 0.779 | 0.590 | 0.189 |
| 1/2 | 0.441 | 0.187 | 0.254 |
| 0.417 | 0.206 | -0.185 | 0.391 |
| 1/3 | -0.209 | -0.497 | 0.288 |

US 8,689,083 B2

RATE-COMPATIBLE PROTOGRAPH LDPC CODES

CROSS-REFERENCE TO RELATED APPLICATIONS

The present application claims priority to U.S. Provisional Application 61/355,050 filed on Jun. 15, 2010, which is incorporated herein by reference in its entirety.

STATEMENT REGARDING FEDERALLY SPONSORED RESEARCH OR DEVELOPMENT

The invention described herein was made in the performance of work under a NASA contract, and is subject to the provisions of Public Law 96-517 (35 USC 202) in which the Contractor has elected to retain title.

BACKGROUND

1. Field

The present disclosure relates to constructing low-density parity-check (LDPC) codes from small template graphs called protographs. More in particular, it relates to methods for designing rate-compatible families of protographs of different rates, where a code at one rate is used as an original code and alternative rate codes are obtained by extending, puncturing, or performing other operations on the original code. Constraints on the resulting parity check matrices are used to ensure that the resulting alternative rate codes provide good performance.

2. Description of Related Art

DEFINITIONS

As known to the person skilled in the art and as also mentioned in U.S. Pat. No. 7,343,539 incorporated herein by reference in its entirety, a low-density parity-check (LDPC) code is a linear code determined by a sparse parity-check matrix H having a small number of 1 s per column. The code's parity-check matrix H can be represented by a bipartite Tanner graph wherein each column of H is represented by a transmitted variable node, each row by a check node, and each "1" in H by a graph edge connecting the variable node and check node that correspond to the column-row location of the "1". The code's Tanner graph may additionally have non-transmitted variable nodes. Each check or constraint node defines a parity check operation. Moreover, the fraction of a transmission that bears information is called the rate of the code. An LDPC code can be encoded by deriving an appropriate generator matrix G from its parity-check matrix H. An LDPC code can be decoded efficiently using a well-known iterative algorithm that passes messages along edges of the code's Tanner graph from variable nodes to check nodes and vice-versa until convergence is obtained, or a certain number of iterations is reached.

A protograph is a Tanner graph with a relatively small number of nodes, connected by a small number of edges, allowing multiple parallel edges between two nodes. Each edge is a type. Thus, the number of total edges represents the number of types that exists in the protograph. A protograph code (an equivalent LDPC code) is a larger derived graph constructed by applying a "copy-and-permutation" operation on a protograph. The protograph is copied N times, then a large LDPC code graph is obtained by permuting N variable-to-check pairs (edges), corresponding to the same edge type of the original protograph. The resulting protograph code has N times as many nodes as the protograph, but it has the same rate and the same distribution of variable and check node degrees. Thus, the degree distribution of a protograph-based LDPC code is the same as that of the protograph. A simple example of a protograph is shown in FIG. 1. This graph consists of 3 variable nodes and 2 check nodes that are interconnected by 6 different edge (variable-to-check) types. The derived graph is constructed by replicating the protograph 3 times, and permuting variable-to-check pairings within the same edge type of the protograph. A protograph can also be represented by a proto-matrix. For example, the proto-matrix of the protograph shown in the left portion of FIG. 1 has the following form:

$$H_{proto} = \begin{pmatrix} 1 & 1 & 0 \\ 2 & 1 & 1 \end{pmatrix}$$

where the rows and columns represent the check nodes and variable nodes in the graph respectively. The elements in the matrix are the number of parallel edges that connect the variable node and the check node associated with their positions. One way to construct larger codes is to replace each integer j in the proto-matrix with sum of j different N×N permutation matrices. If the integer is 1, it would be replaced with 1 N×N permutation matrix. Another way is to first expand the protograph by a small factor such that the H matrix for the resulting expanded protograph does not contain any integer larger than 1. Then each integer 1 in the H matrix will be replaced with an N×N permutation matrix. The assigned N×N permutations can be any type of permutations, including circulant permutations. An N×N identity matrix can be regarded as a trivial permutation matrix. If the N×N permutation is a circulant permutation, then define matrix X as one circular shift of the identity matrix to the left. Using this notation, then all circulant permutations can be represented by $X^i$, for i=0, 1, . . . , (N−1). The selection and assignment of permutation matrices to construct N times larger LDPC code can be based on enlarging the smallest loop size in the expanded graph. Other optimization methods include Progressive Edge Growth (PEG) for circulant matrices (see, for example X. Hu, E. Eleftheriou, and D. M. Arnold, "Regular and irregular progressive edge-growth tanner graphs," *IEEE Transactions on Information Theory*, Vol. 51, issue 1, 2005, pp. 386-398), or the Approximate Cycle Extrinsic message degree (ACE) algorithm (see, for example, T. Tian, C. R. Jones, J. D. Villasenor, and R. D. Wesel, "Selective avoidance of cycles in irregular LDPC code construction," *IEEE Transactions on Communications*, Volume 52, Issue 8, 2004, pp. 1242-1247, or T. Tian, C. R. Jones, J. D. Villasenor, and R. D. Wesel, "Construction of irregular LDPC codes with low error floors," *IEEE International Conference on Communications*, 2003, Vol. 5, pp. 3125-3129). So, in the case of circulant permutations, these optimization algorithms can be applied to obtain powers of X in the H matrix of the expanded protograph.

The rate of a protograph is defined to be the lowest (and typical) rate of any LDPC code constructed from that protograph. All LDPC codes constructed from a given protograph have the same rate except for possible check constraint degeneracies, which can increase (but never decrease) this rate and typically occur only for very small codes. Since the protograph serves as a blueprint for the Tanner graph representing any LDPC code expandable from that protograph, it also serves as a blueprint for the routing of messages in the iterative algorithm used to decode such expanded codes through a permutation per each edge type. The rate of a protograph code is computed as follows:

$$r = \frac{n-m}{n-n_0}$$

where n and m are number of variable nodes and check nodes respectively in the protograph, $n_0$ is number of punctured (untransmitted) variable nodes.

Excluding check nodes connected to degree-1 variable nodes, applicants have proved that the number of degree-2 nodes should be at most one less than the number of check nodes provided that no loop exists in the graph between degree-2 nodes and the checks connected to these nodes for a protograph to have the linear minimum distance property. A given protograph is said to have the linear minimum distance property if the typical minimum distance of a random ensemble of arbitrarily large LDPC codes built from that protograph grows linearly with the size of the code, with linearity coefficient which can be denoted by $\delta_{min}>0$ (see S. Abu-Surra, D. Divsalar and W. Ryan, "On the existence of typical minimum distance for protograph-based LDPC codes," in Information Theory and Applications Workshop (ITA), January 2010, pp. 1-7).

The iterative decoding threshold of a given protograph is similarly defined with respect to this random ensemble of LDPC codes as the lowest value of signal-to-noise ratio for which an LDPC decoder's iterative decoding algorithm will find the correct codeword with probability approaching one as the size of an LDPC code built from that protograph is made arbitrarily large. Iterative decoding thresholds can be calculated by using a reciprocal channel approximation (D. Divsalar, S. Dolinar, C. R. Jones, and K. Andrews, "Capacity approaching protograph codes," *IEEE J. Select. Areas Communication*, vol. 27, no. 6, pp. 876-888, August 2009) or the PEXIT method (see, for example, G. Liva and M. Chiani, "Protograph LDPC codes design based on EXIT analysis," in *Proc. IEEE GLOBECOM*, November 2007, pp. 3250-3254). Thresholds can be lowered either by using precoding (a subgraph of the protograph with degree-1 nodes, check nodes connected to these degree-1 nodes, and all edges connected to these checks and other variable nodes with at least one punctured node) or through the use of at least one very high-degree node in the base protograph. A protograph is said to have a low iterative decoding threshold if its threshold is close to the capacity limit for its rate.

A family of protographs of different rates is said to be rate-compatible with embedding or embedded rate-compatible if the protographs for different rates produce embedded codewords with the same information block-length. In other words, with the same input, the codeword of a high-rate code is embedded into the codeword of a lower-rate code. This property makes this family of protographs suitable for Hybrid Automatic Repeat Request (HARQ) applications. The rate-compatible families described in the present disclosure are rate-compatible with embedding and can be implemented within a common encoding/decoding infrastructure.

The most common way of generating rate-compatible family of codes is puncturing, i.e., starting with a low-rate mother code and then selectively discarding some of the coded bits to arrive at higher rate codes. This approach is simple but is not free of problems. Specifically, (1) the mother code is optimally designed for low rates, so higher-rate punctured codes have a wider gap to capacity; and (2) the optimal low rate code structure and puncturing patterns are designed separately, which is suboptimal. Even though it has been shown that puncturing can theoretically achieve the same gap to capacity as the mother code, in existing codes puncturing has increased the gap significantly.

Code extension starts with a high-rate code (a daughter code), and then lower rate codes are obtained by extending the parity check matrix of the daughter code. A protograph code is an LDPC code that can be constructed from a small protomatrix with a few elements. While previous works (N. Jacobsen and R. Soni, "Design of rate-compatible irregular LDPC codes based on edge growth and parity splitting," in *Proc. IEEE Vehicular Technology Conference (VTC)*, 30 2007, Oct. 3 2007, pp. 1052-1056 and references therein) are mainly designed for rate-compatible irregular LDPC codes with highly optimized framework and unstructured design, rate-compatible protograph-based codes can achieve very good thresholds with low encoder complexity as well as fast decoding (D. Divsalar, S. Dolinar, C. R. Jones, and K. Andrews, "Capacity approaching protograph codes," *IEEE J. Select. Areas Communication*, vol. 27, no. 6, pp. 876-888, August 2009). Several protograph-based rate-compatible codes have been produced by El-Khamy at al. (M. El-Khamy, J. Hou, and N. Bhushan, "Design of rate-compatible structured LDPC codes for hybrid ARQ applications," *IEEE J. Select. Areas Commun.*, vol. 27, no. 6, pp. 965-973, August 2009 and references therein) whose design starts with a good protograph followed by puncturing or node splitting methods. These methods do not guarantee to cover all possible connections in a graph structure, thus they result in higher decoding thresholds.

Codes using a pre-accumulator and a punctured node were devised in Divsalar at al. (D. Divsalar, S. Dolinar, C. R. Jones, and K. Andrews, "Capacity approaching protograph codes," *IEEE J. Select. Areas Communications*, vol. 27, no. 6, pp. 876-888, August 2009). However, this code structure by itself is not sufficient for a rate-compatible family that must have the same information block size, otherwise it is not useful for, e.g., HARQ applications. The paper of Dolinar (S. Dolinar, "A rate-compatible family of protograph-based LDPC codes built by expurgation and lengthening," in *Proc. IEEE ISIT*, September 2005, pp. 1627-1631) discusses the production of rate-compatible protograph codes based on node-splitting and attaching additional accumulators, but these codes are only available for rates higher than 1/2 and, furthermore, their gap to capacity can be improved upon.

The present disclosure is related to the design method of protographs described in U.S. Pat. No. 7,343,539 and U.S. Patent Application Publication 2008/0294969. In these two disclosures, the design methods are mainly based on applying a node splitting or pre-coding technique from a given LDPC code. This technique does not take care of all possible edge connections in a protograph structure and may result in protograph codes with high gap to capacity limits.

SUMMARY

Described herein are embodiments that provide for digital communication coding methods resulting in rate-compatible low density parity-check (LDPC) codes built from protographs. Described digital coding methods start with a desired code rate and a selection of the numbers of variable nodes and check nodes to be used in the protograph. Constraints are set to satisfy a linear minimum distance growth property for the protograph. All possible edges in the graph are searched for the minimum iterative decoding threshold and the protograph with the lowest iterative decoding threshold is selected. Protographs designed in this manner may be used in decode and forward relay channels.

An embodiment of the disclosed invention is a digital communication coding method, comprising: selecting a desired rate to be implemented by a low-density parity-check (LDPC) code represented by a protograph; selecting a number of variable nodes and a number of check nodes to be implemented in the protograph; selecting constraints for the protograph; searching for all possible edges in the protograph to create computed permutations of the protograph; computing an iterative decoding threshold for each computed permutation of the protograph; and selecting the protograph with a lowest computed iterative decoding threshold to implement the LDPC code. Constraints for the protograph may be selected to satisfy a linear minimum distance property.

Another embodiment of the disclosed invention is a digital communication coding method for embedded rate-compatible LDPC codes comprising: selecting a higher rate code represented by a higher rate parity check matrix with a higher rate row dimension and a higher rate column dimension; constructing a protograph represented by a lower rate parity matrix, wherein the lower rate parity matrix is created by extending the higher rate parity matrix by an equal number of added columns and added rows, wherein the added columns and added rows form three submatrices within the lower rate parity matrix, a first submatrix of the three submatrices having a location within the lower rate parity matrix defined by the added columns and the higher rate row dimension, a second submatrix of the three submatrices having a location within the lower rate submatrix defined by the added rows and the lower rate column dimension, and a third submatrix of the three submatrices having a location defined by the added columns and added rows, and wherein the first submatrix is a zero submatrix; constraining edges in the second and third submatrix to maintain linear growth of minimum distance; computing an iterative decoding threshold for each computed permutation of the protograph; and selecting the protograph with a lowest computed iterative decoding threshold to implement an LDPC code.

Another embodiment of the disclosed invention is a digital communication coding method for rate-compatible LDPC codes comprising: selecting a first rate code represented by a first rate parity check matrix; constructing a second rate parity check matrix by extending the first rate parity check matrix by one or more rows or one or more columns or one or more rows and columns; selecting constraints for a protograph resulting from the second rate parity check matrix; searching for all possible edges in the protograph to create computed permutations of the protograph; computing an iterative decoding threshold for each computed permutation of the protograph; and selecting the computed permutation of the protograph with a lowest computed iterative decoding threshold to implement an LDPC code, wherein the implemented LDPC code comprises a code at a second rate. A constraint may be selected for the protograph to satisfy a linear minimum distance property. The first rate code may be a high rate code and the first rate parity check matrix may be extended by adding one or more rows. The first rate code may be a low rate code and the first rate parity check matrix may be extended by adding one or more columns.

Another embodiment of the disclosed invention is a method for transmission within a half-duplex relay channel having at least one relay, the method comprising: selecting a first LPDC code with a rate necessary to support transmission of source data from a source to a destination, wherein the first LDPC code is represented by a first protograph; adding one or more second protograph variable nodes to the first protograph to create a second protograph wherein the second protograph has a linear distance property and the second protograph implements a second LDPC code; transmitting data from a source with the source data encoded with the second LDPC code; receiving data coded with the second LDPC code at a relay; decoding the data received at the relay to extract the second LDPC codeword; selecting a subset of the variable nodes of the second protograph and adding one or more variable and check nodes to create a third protograph, wherein the third protograph implements a third LDPC code; encoding the one or more variable nodes of the third LDPC code with a fourth LDPC code; transmitting from the relay the added one or more variable nodes coded with the fourth LPDC code to a destination; decoding data received at the destination to extract the added one or more variable nodes with the fourth LDPC code; decoding a subset of the data received at the destination that constitutes the third LDPC codeword to extract a subset of the second LDPC codeword that excludes the first LDPC codeword; decoding the remaining part of data received at the destination with the first LDPC code to extract the first LDPC codeword; the source data is extracted from the extracted second LDPC codeword at the destination. The second protograph preferably has a higher rate that constitutes a weaker code that is sufficient to support transmission of source data from the source to the relay.

Another embodiment of the disclosed invention is a method for transmission within a half-duplex relay channel having at least one relay, the method comprising: selecting a first LPDC code with a rate necessary to support transmission of source data from a source to a relay, wherein the first LDPC code is represented by a first protograph; adding one or more check nodes and variable nodes to the first protograph to create a second protograph with a lower rate necessary to support transmission of source data from the source to a destination, wherein the second protograph has a linear distance property and the second protograph implements a second LDPC code; transmitting data from the source with the source data encoded with the first LDPC code; receiving data coded with the first LDPC code at a relay; decoding the data received at the relay to extract source data coded with the first LDPC code; computing at the relay the added one or more variable nodes corresponding to the second LDPC code; encoding the computed one or more variable nodes with a third LDPC code; transmitting the computed one or more variable nodes coded with the third LDPC code to a destination; decoding data received at the destination to extract the computed one or more variable nodes with the third LDPC code; and decoding data received at the destination using the computed one or more variable nodes to extract the source data from data received at the destination with the second LDPC code.

Another embodiment of the disclosed invention is a method for transmission within a half-duplex relay channel having two or more relays, the method comprising: selecting a first LPDC code with a rate necessary to support transmission of source data from a source to a first relay, wherein the first LDPC code is represented by a first protograph; adding one or more check and variable nodes to the first protograph to create a second protograph with a lower rate necessary to support transmission of source data from the source to a second relay, wherein the second protograph has a linear distance property and the second protograph implements a second LDPC code; adding one or more check and variable nodes to the second protograph to create a third protograph with a lower rate necessary to support transmission of source data from the source to a destination, wherein the third protograph has a linear distance property and the third protograph implements a third LDPC code; transmitting data from the source with the source data encoded with the first LDPC code; receiving data coded with the first LDPC code at a first relay; decoding the data received at the first relay to extract the source data coded with the first LDPC code; computing at the first relay one or more added first relay variable nodes in the second LDPC code; encoding the one or more added first relay variable nodes with a fourth LDPC code; transmitting from a first relay the one or more added first relay variable nodes coded with the fourth LPDC code; decoding data received at the second relay to extract the one or more added first relay variable nodes coded with the fourth LDPC code; decoding data received at the second relay using the extracted one or more added first relay variable nodes to extract the source data coded with the second LDPC code; computing at the second relay one or more added second relay variable nodes to produce a third LDPC codeword; encoding the one or more added second relay variable nodes with a fifth LDPC code; transmitting the fifth LDPC code from the second relay to a destination; decoding the fifth LDPC code at the destination to extract the one or more added second relay variable nodes; decoding the fourth LDPC code at the destination to extract the one or more added first relay variable nodes; and decoding a destination message using the one or more added first relay variable nodes and the one or more added second relay variable nodes to extract the source data.

BRIEF DESCRIPTION OF THE SEVERAL VIEWS OF THE DRAWINGS

FIG. 4 shows a rate-1/2 protograph and its protomatrix whose iterative decoding threshold of 0.395 dB with a gap of only 0.208 dB to its relative capacity limit and having linear minimum distance grow property.

FIG. 5 and FIG. 6 show the protomatrices of high-rate (>1/2) protographs that extend from rate-1/2 protograph of FIG. 4. All protographs have linear minimum distance growth property.

FIG. 7 shows the iterative decoding thresholds of all codes whose protomatrices are shown in FIG. 5 and FIG. 6.

FIG. 9 shows protomatrices of rate-compatible family built from extending from rate-3/4 protograph whose protomatrix is shown in FIG. 5.

FIG. 11 shows the protomatrices of protographs that expurgate from rate-3/4 code given in FIG. 5.

DETAILED DESCRIPTION

The method of the present disclosure provides that a simple search of all possible edge connections in a protograph structure results in a protograph having smaller gap to capacity compared with those codes reported in these two patents. The resulting protograph codes can be implemented by similar encoding method in the U.S. Pat. No. 7,499,490.

The codes constructed in accordance with the methods described in the present disclosure may fall into three categories. Each can find applications in different scenarios. The three categories are: (1) LDPC codes built from individual protographs having the linear minimum distance property and low iterative decoding threshold close to the capacity limits for their respective rates; (2) Rate-compatible families of LDPC codes for adaptive coding and/or the relay channel built from a family of protographs of different rates all having the linear minimum distance property within a common encoding/decoding infrastructure; (3) Rate-compatible families of LDPC codes with the same information block size, suitable for HARQ applications, built from a family of protographs of different rates all having the linear minimum distance property within a common encoding/decoding infrastructure.

Design of Rate-1/2 Protograph

Figure 1:
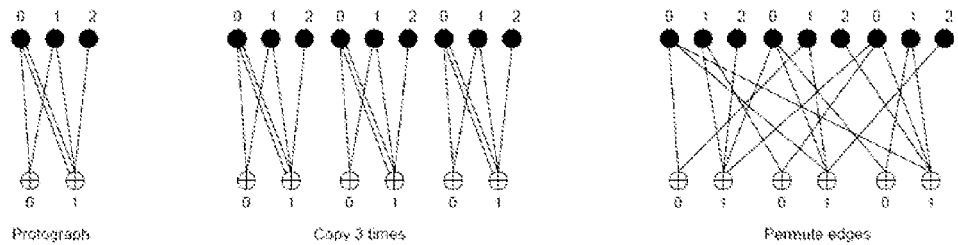
FIG. 1 shows an example of a protograph and demonstrates a copy-and-permute operation on the protograph to obtain a larger graph. The protograph also can be represented by a protomatrix whose elements present the number of edges connecting a variable node (column) to a check node (row) in the protograph.
Figure 2:
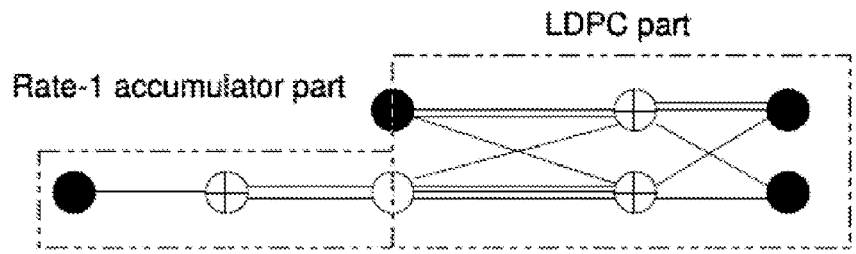
FIG. 2 shows a protograph of rate-1/2 AR4JA code (as reported in the U.S. Pat. No. 7,343,539 and U.S. Patent Publication No. 2008/0294969).

A well-known protograph family, the AR4JA family, follows the structure with a degree-1 node (see FIG. 2). This family of codes is simple and powerful and has iterative decoding thresholds close to capacity (about 0.4 dB). It also enjoys linear growth of minimum distance with codeword length. In the AR4JA rate-compatible structure, the rate-1/2 code is designed first, and then the additional variable nodes are added to create higher rate codes. The structure of the rate-1/2 code is shown in FIG. 2 as a concatenation of a pre-coder (degree-1 part or a rate-1 accumulator) with an LDPC. The proto-matrix of the rate-1/2 AR4JA protograph is:

$$H_{1/2} = \begin{pmatrix} 1 & 2 & 0 & 0 & 0 \\ 0 & 3 & 1 & 1 & 1 \\ 0 & 1 & 2 & 2 & 1 \end{pmatrix}$$

Using the PEXIT technique, this rate-1/2 code has the threshold of 0.6337 dB. The LDPC protograph subgraph, i.e., the two rows in the right-bottom part of above equation, consists of only two check nodes. Following the linear minimum distance criteria described above, there is only one degree-2 variable node allowed in the protograph structure. A higher-rate code is generated by adding two additional degree-3 variable nodes.

Although it is a good code, the AR4JA code has not been designed by a systematic search of the design space and therefore it can be improved upon. Described below is a method for a systematic and efficient search of the design space that finds better codes with lower iterative decoding thresholds.

The basic design procedure has the following steps: 1) Start with a desired code rate; 2) Determine how many variable nodes and check nodes needed in the protograph; 3) Set a list of constraints in order to satisfy linear minimum distance growth; 4) Search for all possible edges in the graph and compute iterative decoding threshold for each case; and 5) Select the graph that offers the lowest iterative decoding threshold.

To clarify this method, first consider the following example for the design of a rate-1/2 protograph code. A simple protograph structure which has 7 variable nodes (of which the third node is punctured) and 4 check nodes will be the starting point for this example. The rate R of the proposed protograph is as follows: R=(7−4)/(7−1)=3/6=1/2. A punctured variable node has been included since it has been observed that punctured (un-transmitted) variable nodes can improve performance (see, for example, T. Richardson and R. Urbanke, "Multi-edge type LDPC codes," Tech. Rep. 2004; A. Abbasfar, D. Divsalar, and K. Yao, "Accumulate-repeat-accumulate codes," *IEEE Trans. Commun.*, vol. 55, no. 4, pp. 692-702, April 2007). The protograph may also be represented by its 4×7 proto-matrix. This proto-matrix contains 28 elements that indicate how many parallel edges connect equivalent check and variable nodes in the protograph structure. Optimization over these 28 variables is computationally complex and the finding of the optimum in a high-dimensional terrain is difficult, therefore adjustments to this optimization problem are necessary to make a practical solution viable.

One degree-1 variable (one column of weight-1), and one degree-2 variable (column of weight-2) are so far instituted. Therefore the protomatrix up to this point is:

$$H_{1/2}^{search} = \begin{pmatrix} 1 & 0 & y & y & y & y & y \\ 0 & 1 & x & x & x & x & x \\ 0 & 1 & x & x & x & x & x \\ 0 & 0 & x & x & x & x & x \end{pmatrix}_{4 \times 7}$$

The variables x and y designate the remainder of the protograph to be designed. The overall code is effectively the concatenation of a Low Density Generator Matrix (LDGM) code (first row and column) with an LDPC code (columns 2 through 7, rows 2 through 4). The linear minimum distance growth only involves the LDPC part. Therefore all the comments in the remainder of this paragraph are focused on this submatrix. To have linear minimum distance growth (see S. Abu-Surra, D. Divsalar and W. Ryan, "On the existence of typical minimum distance for protograph-based LDPC codes," in *Information Theory and Applications Workshop (ITA)*, January 2010, pp. 1-7), the number of degree-2 nodes in the LDPC protograph must be limited to the number of check nodes in the LDPC part minus 1, that is 3−1=2. So no more than two degree-2 nodes can be used, i.e., the number of degree-2 nodes can be either one or two. Furthermore, degree-2 nodes cannot form a cycle among themselves.

Other variable nodes within the LDPC part of the matrix must have degree at least 3 except one highest degree node, therefore the sum of columns designated as x, except for degree-2 nodes, must be 3 or higher. To limit the search space, the maximum number of parallel edges in the protograph is constrained. Via experiments, it has been observed that increasing the number of parallel edges beyond a certain point is not useful. The reason is that subject to a given code length, increasing the number of parallel edges will increase the likelihood of short cycles. For the third node (column), the maximum number of parallel edges is set to 3. For the remaining nodes, the maximum number of parallel edges is set to 2. These constraints reduce both the dimensionality of the search space as well as the breadth of the discrete search in each dimension, making a systematic search viable. The result of optimization for this particular example is as follows:

$$H'_{1/2} = \begin{pmatrix} 1 & 0 & 2 & 0 & 0 & 1 & 0 \\ 0 & 1 & 3 & 1 & 1 & 1 & 0 \\ 0 & 1 & 1 & 2 & 2 & 2 & 1 \\ 0 & 0 & 2 & 0 & 0 & 0 & 2 \end{pmatrix}_{4 \times 7}$$

Figures 4, 5:
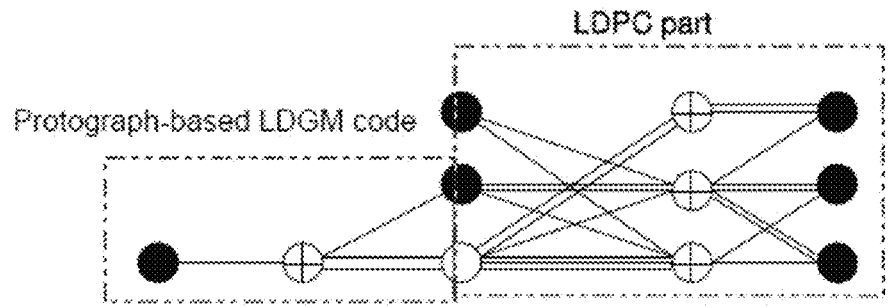

The threshold of this code is 0.395 dB which shows a gap of 0.208 dB of capacity, less than that of the rate-1/2 AR4JA code described in U.S. Pat. No. 7,343,539. The new protograph is shown in FIG. 4.

If the linear minimum distance growth criteria is not imposed, the optimization procedure yields a protograph with a lower threshold that has a proto-matrix as follows:

$$H_{1/2}^{opt} = \begin{pmatrix} 1 & 0 & 2 & 0 & 0 & 1 & 0 \\ 0 & 1 & 2 & 0 & 0 & 1 & 0 \\ 0 & 1 & 1 & 2 & 2 & 2 & 0 \\ 0 & 0 & 3 & 1 & 1 & 1 & 1 \end{pmatrix}$$

Figure 3:
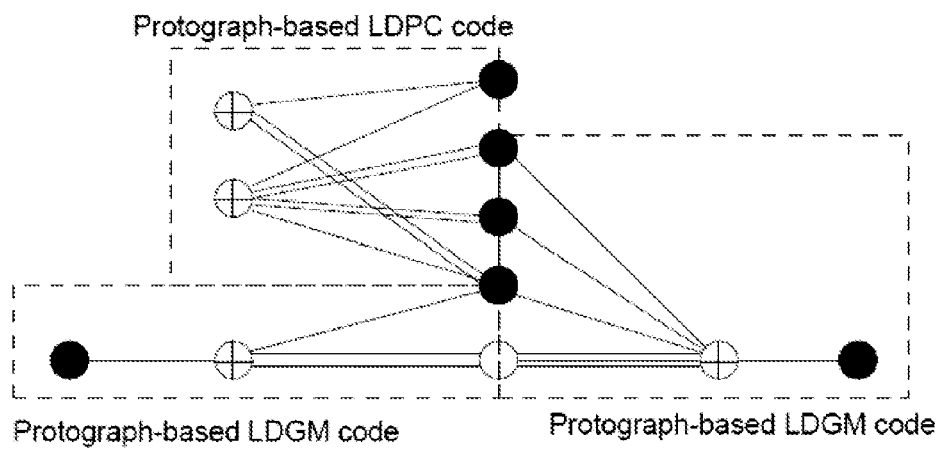
FIG. 3 shows a rate-1/2 protograph and its protomatrix whose iterative decoding threshold of 0.250 dB with a gap of only 0.063 dB to its relative capacity limit.

This code has a threshold of 0.250 with a gap of only 0.063 dB to capacity. While this may be the best iterative decoding threshold reported for a structured (non-random) code in the literature, but it does not mean it is a good code. In fact, this is the concatenation of two LDGM codes (the first column-row; and last column-row) with one LDPC code (corresponding to the middle sub-matrix) as shown in FIG. 3. Therefore the minimum distance of this code does not grow linearly with codeword length and it may suffer from an error floor. The LDPC subgraph has too many degree-2 variable nodes (3 degree-2 variables and 2 checks) which violate the condition for linear minimum distance as described in S. Abu-Surra, D. Divsalar and W. Ryan, "On the existence of typical minimum distance for protograph-based LDPC codes," in *Information Theory and Applications Workshop (ITA)*, January 2010, pp. 1-7.

Design of High Rate Protograph Codes by Lengthening

The discussion above focuses on rate-1/2 protograph codes. Designing higher rate protographs is more difficult because the proto-matrix contains many more elements than those of a rate-1/2 protograph. In the discussion below, a simple approach to overcome this difficulty is described. Codes whose iterative decoding thresholds are close to capacity are produced. These codes reside within a family of codes that has a nested structure and offers a range of rates with a common encoder and decoder infrastructure. A family of high-rate protograph codes is constructed from a low-rate protograph by code lengthening, i.e., by lengthening the parity matrix of a lower-rate code (a base code) in the form of $H_{highrate} = [H_1 H_e]$. $H_1$ is the parity check matrix of the low-rate code and $H_e$ is an extension matrix.

Several families of nested protograph codes based on code lengthening have been reported in the literature using node splitting and permutation of the edges in an ad hoc manner that is not feasible to generalize to various mother codes and various rates. See, for example, D. Divsalar, S. Dolinar, C. R. Jones, and K. Andrews, "Capacity approaching protograph codes," *IEEE J. Select. Areas Commun.*, vol. 27, no. 6, pp. 876-888, August 2009, and A. Abbasfar, D. Divsalar, and K. Yao, "Accumulate-repeat-accumulate codes," *IEEE Trans. Commun.*, vol. 55, no. 4, pp. 692-702, April 2007. Therefore, there is motivation in devising a systematic approach for the design of nested protograph codes.

Described below is an example for the design of high-rate codes with rate $R=(n+1)/(n+2)$ for $n=1, 2 \ldots$ as an extension of the optimized rate-1/2 protograph shown in FIG. 4. These codes have a minimum distance that grows linearly with code length. Similar to the previous section, the search space for the target code is described in the following way:

$$H_{\frac{n+1}{n+2}}^{search} = \left( H'_{\frac{n}{n+1}} \left| \begin{array}{ccc} y & y & y \\ x & x & x \\ x & x & x \\ x & x & x \end{array} \right. \right)$$

where variables y in the first row correspond to the check node that connects to the degree-1 variable node. Variable x in rows 2-4 constitute the extension to the LPDC subgraph. In order to preserve the linear growth of minimum distance for the new high rate codes, the column sums in the LDPC subgraph, namely sums of columns designated with variable x, should be 3 or higher. This constraint ensures that all variables in the LDPC part of the extension structures have degree≥3. The problem may be simplified by setting the maximum number of parallel edges to 2 (i.e. x, y=0, 1, 2). The result of optimization for this particular example is shown in FIG. 5 and FIG. 6. The iterative decoding thresholds of these codes are given in FIG. 7. For rates>2/3, the produced codes have decoding thresholds within 0.09 dB of capacity, and the rate-2/3 code has a threshold within 0.122 dB of capacity.

Design of Rate-Compatible Protograph Codes for HARQ Applications

Note that, in the family of nested codes described above, the information block-lengths of the nested codes are not identical. The same is true of AR4JA codes. Thus, these codes are not suitable for HARQ applications. Several works in the literature present designed irregular LDPC codes for HARQ applications using puncturing and code extension where the code design typically requires painstaking optimization. See, for example, N. Jacobsen and R. Soni, "Design of rate-compatible irregular LDPC codes based on edge growth and parity splitting," *Proc. IEEE Vehicular Technology Conference (VTC)*, 2007, pp. 1052-1056; J. Li and K. R. Narayanan, "Rate-compatible low density parity check codes for capacity-approaching ARQ schemes in packet data communications," *Proc. CIIT*, November 2002; M. R. Yazdani and A. H. Banihashemi, "On construction of rate compatible low-density parity-check codes," *IEEE Commun. Lett.*, Vol. 8, no. 3, pp. 159-161, March 2004; J. Ha, J. Kim, and S. McLaughlin, "Rate-compatible puncturing of low density parity-check codes," *IEEE Trans. Inform. Theory*, Vol. 50, No. 11, pp. 2824-2836, November 2004; and H. Pishro-Nik and F. Fekri, "Results on punctured LDPC codes," *Proc. IEEE Information Theory Workshop*, October 2004, pp. 215-219. Furthermore, the encoders for these codes are unstructured and, therefore, are computationally complex. In contrast, codes that can be represented by protographs with a circulant permutation per edge type structure are generally more desirable for ease of encoder and decoder implementation.

M. El-Khamy, J. Hou, and N. Bhushan, "Design of rate-compatible structured LDPC codes for hybrid ARQ applications," *IEEE J. Select. Areas Commun.*, vol. 27, no. 6, pp. 965-973, August 2009, describe the design of rate-compatible protograph LDPC codes by first extending and randomly pruning from an existing protograph to produce a low-rate code, and then obtaining other high-rate codes by puncturing this low-rate code. As described above, puncturing has several weaknesses and usually results in codes that have iterative decoding thresholds with a wider gap to capacity than that of the low-rate mother code. However, the weaknesses of puncturing can be avoided by using a code extension approach, as described below.

Figures 8, 10:
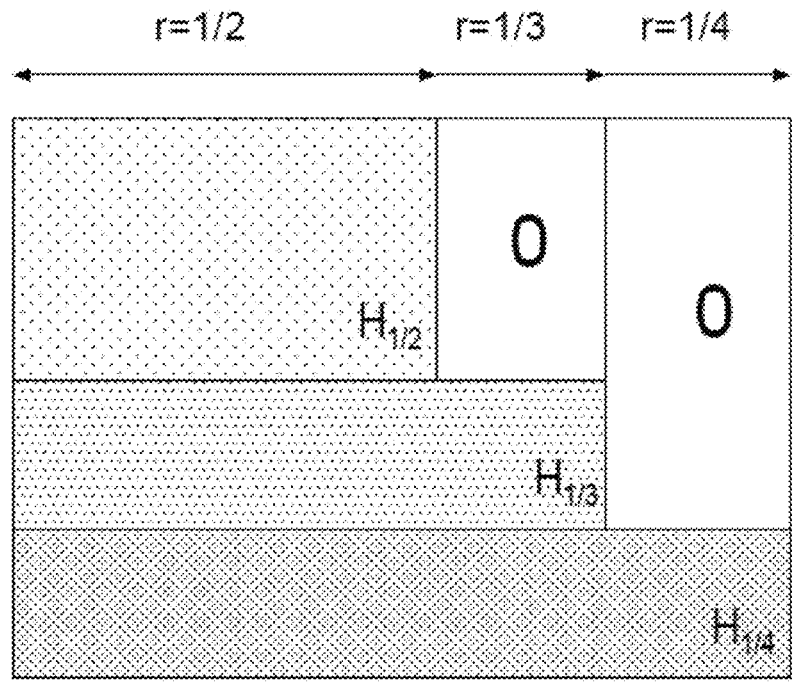
FIG. 8 shows embedded rate-compatible parity matrix structures and an extension method for those structures (for example, a rate-1/3 protograph is obtained by extending from a rate-1/2 protograph)
FIG. 10 shows the iterative decoding thresholds of the rate-compatible protographs whose protomatrices are shown in FIG. 9.

New rate-compatible family of codes can be constructed by extending the parity matrix H of a high-rate protograph code by an equal number of columns (variable nodes) and rows (check nodes). Since the data block size is proportional to the difference between the number of variable and check nodes, this will ensure that the new code will have the same data block size. This idea is illustrated in FIG. 8. In FIG. 8, the parity check matrix $H_{1/3}$ of the rate-1/3 code is obtained by extending that of the rate-1/2 code. The parity check matrix $H_{1/4}$ of the rate-1/4 code is again extended from that of the rate-1/3 code. This structure forms a nested family of rate-compatible codes. The zero submatrices ensure that the incremental variable nodes are indeed new parity bits that are purely determined by the new parity check equations and are not affected by the parity check equations of the higher-rate code. This is necessary to guarantee that the high-rate code is nested inside the low-rate code.

One construction of a nested rate-compatible family of codes is presented below as an exemplary embodiment. However, the proposed method is completely general; one can start from any high-rate code to build a successive set of lower-rate codes. The starting point for the following construction is the rate-3/4 protograph code whose proto-matrix is described in FIG. 5. Since an equal number of columns and rows are added to the proto-matrix, the lower-rate codes obtained from the rate-3/4 code above have rates $R=(13-4)/(13-1+N)=9/(12+n)$ where n is the number of checks and variables added. For each value of n, the new code will require a search. As a representative sample, an example of the search for n=3 is presented, which yields a rate-0.6 code. The search space for this new code is in the form:

$$H_{0.6}^1 = \left( \begin{array}{ccccccc|ccc} & & & & & & & 0 & 0 & 0 \\ & & & H'_{3/4} & & & & 0 & 0 & 0 \\ & & & & & & & 0 & 0 & 0 \\ & & & & & & & 0 & 0 & 0 \\ \hline 0 & x & y & x & \ldots & \ldots & \ldots & x & 1 & 0 & 0 \\ 0 & x & y & x & \ldots & \ldots & \ldots & x & z & 1 & 0 \\ 0 & x & y & x & \ldots & \ldots & \ldots & x & z & z & 1 \end{array} \right)$$

The problem is to find edges that connect the old graph (the rate-3/4 code) to 3 new check nodes and variable nodes. The unknown edges are represented with variables x, y and z, which are divided into two types. The first edge type is the ones that connect the variables of the old graph to new checks, denoted by x and y, where variables y are edges connecting to the highest degree variable node in the old graph, and variables x are the remaining edges connecting to the rest of old variables except degree-1 node. The other type consists of edges that connect the new variable nodes to the new check nodes, denoted by variable z in the right-bottom corner submatrix. In order to maintain linear growth of minimum distance, more care is needed in this case since degree-2 variables that form short cycles may arise. Therefore the problem may be further simplified by setting this submatrix to be a lower triangular.

The optimization process is simplified by further limiting the maximum number of parallel edges. For example, y can be set to the values of 1, 2, x and z to the values of 0, 1. The resulting family of rate-compatible codes has proto-matrices given in FIG. 9. The thresholds of the new rate-compatible codes are shown in FIG. 10. As seen in the table, these codes have thresholds uniformly within 0.1 dB of their capacity limits. All the codes have linear minimum distance property.

Design of New Protograph Codes by Expurgating a High-Rate Protograph

A new family of protographs can also be designed by expurgating a high-rate protograph, i.e. to add several additional parity checks into an existing high-rate protograph to produce a lower-rate protograph code. This approach has applications in multi-node scenarios, i.e. the relay channel discussed below. The resulting protograph is called an expurgated protograph code.

A new expurgated protograph is designed by following structure:

$$H_{BE} = \left[\frac{H_1}{H_e}\right].$$

where $H_1$ is the parity check matrix or protomatrix of a high-rate protograph, $H_e$ is additional check matrix (check nodes) need to be designed based on existing structure of $H_1$.

Figures 12, 13:
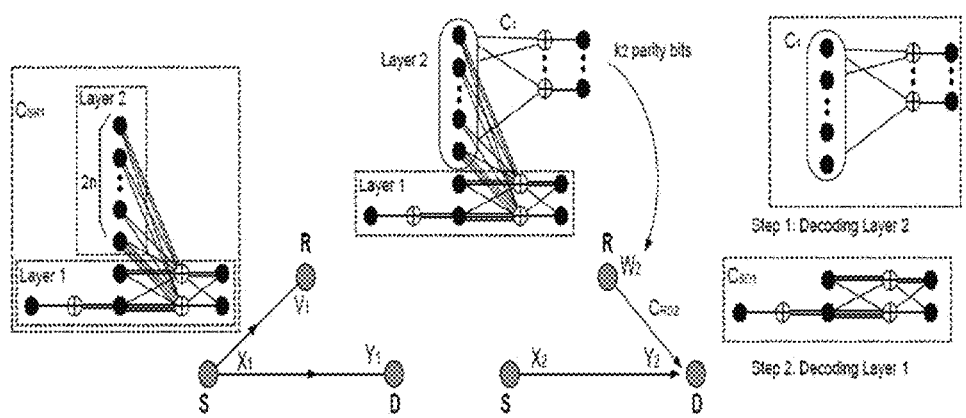
FIG. 12 shows the iterative decoding thresholds of the expurgated protographs whose protomatrices are shown in FIG. 11.
FIG. 13 shows the application of lengthening protograph design given in FIG. 5 and FIG. 6 in one-relay half-duplex channel.

Described below is an example of designing a family of expurgated protographs based on a rate-3/4 protograph which is one member of lengthening protograph family shown in FIG. 5. Applying the same above design procedure, the new family of protographs is shown in FIG. 11. The iterative decoding thresholds of the new expurgated protograph codes are shown in FIG. 12. As seen in the table, these codes have thresholds within 0.4 dB of their capacity limits. All the codes have linear minimum distance property.

Application of Lengthening Protograph Codes and Expurgated Protograph Codes in Decode-and-Forward Half-Duplex Relay Channel Relay channels describe a network scenario where the source transmits its data to the destination with the help of one or more nearby relays. This cooperative scheme is an effective solution for up-coming high throughput wireless systems (e.g. LTE, 4G) by providing an additional spacial gain, namely user cooperation diversity (see, for example; A. Sendonaris, E. Erkip, and B. Aazhang, "User cooperation diversity. Part I: System Description," *IEEE Trans. Commun.*, vol. 51, no. 11, pp. 1927-1938, November 2003; and A. Sendonaris, E. Erkip, and B. Aazhang, "User cooperation diversity. Part II. implementation aspects and performance analysis," *IEEE Trans. Commun.*, vol. 51, no. 11, pp. 1939-1948, November 2003), or cooperative diversity (see, for example, T. Hunter and A. Nosratinia, "Cooperation diversity through coding," *Proc. IEEE ISIT*, June 2002, p. 220; J. Laneman, D. Tse, and G. Wornell, "Cooperative diversity in wireless networks: Efficient protocols and outage behavior," *IEEE Trans. Inform. Theory*, vol. 50, no. 12, pp. 3062-3080, December 2004; and J. Laneman and G. Wornell, "Distributed space-time-coded protocols for exploiting cooperative diversity in wireless networks," *IEEE Transactions on Information Theory*, vol. 49, no. 10, pp. 2415-2425, October 2003). This spacial gain comes from the nature of the wireless environment among users in a wireless system. Those users are able to freely receive the source's signal and then able to help the source to transmit at higher data rates to its target user. Though the capacity of a relay channel in general is unknown, many research progresses have been made. Relay protocols and their theoretic information capacity results have been extensively studied. See, for example, T. Cover and A. E. Gamal, "Capacity theorems for the relay channel," *IEEE Trans. Inform. Theory*, vol. 25, no. 5, pp. 572-584, September 1979, and G. Kramer, M. Gastpar, and P. Gupta, "Cooperative strategies and capacity theorems for relay networks," *IEEE Trans. Inform. Theory*, vol. 51, no. 9, pp. 3037-3063, September 2005.

Although significant progress has been made in the relay coding problem, existing LDPC codes must be painstakingly optimized to match to a single set of channel conditions, many of them do not offer easy encoding, and most of them do not have structured design. The application of protograph codes in the relay channel address three important issues in an integrative manner: low encoding complexity, modular structure allowing for easy design, and rate-compatibility so that the code can be easily matched to a variety of channel conditions without extensive re-optimization. In addition, the proposed protograph codes offer excellent performance.

One Relay Channel

Figure 14:
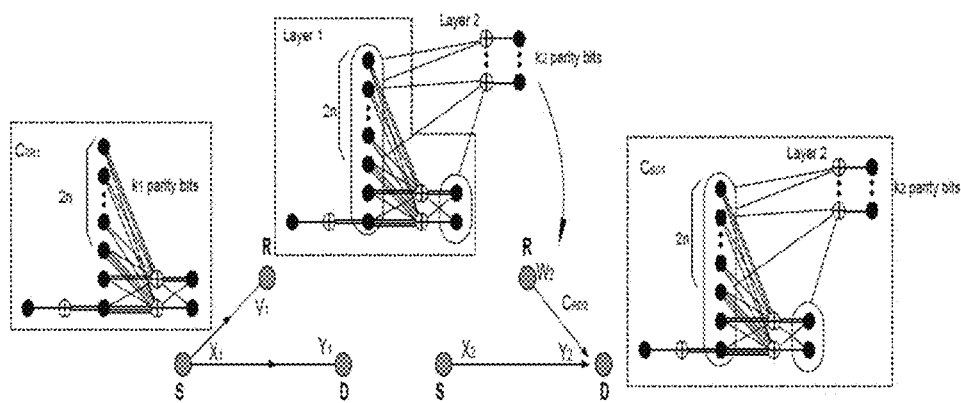
FIG. 14 shows the application of expurgating protograph design given in FIG. 9 in one-relay half-duplex channel.

A half-duplex relay channel is shown in FIG. 13 and FIG. 14. For this example, only a decode-and-forward protocol is considered. $X_i$ and $W_i$ denote the transmitted signals from the source (S) and the relay (R) while $Y_i$ and $V_i$ denote the received signals at the destination (D) and relay respectively. Subscript 1 denotes broadcast (BC) mode transmitted in the duration t, where t is a normalized time parameter taking values between zero (beginning of transmission interval) and one (end of transmission interval), and subscript 2 denotes the multiple access (MAC) mode transmitted in duration t'=1−t.

$$V_1 = h_{SR}X_1 + N_{R_1}$$

$$Y_1 = h_{SD}X_1 + N_{D_1}$$

$$Y_2 = h_{SD}X_2 + h_{RD}W_2 + N_{D_2}$$

Where $h_{SR}$, $h_{SD}$ and $h_{RD}$ are the S-to-R, S-to-D and R-to-D channel coefficients respectively, $N_{R1}$, $N_{D1}$ and $N_{D2}$ are the noise samples at the relay and the destination in broadcast and MAC modes, respectively. All noise samples are assumed to be Gaussian with zero mean and unit variance.

An average system transmission power constraint is imposed on the nodes as:

$$tP_{S1} + t'(P_{S2} + P_{R2}) \leq P$$

where $P_{S1} = E[X_1^2]$ represents the source transmission power in BC mode at duration t, similarly $P_{S2}$ and $P_{R2}$ represent the source and relay transmission powers in the MAC mode at duration t'=1−t, and P represents the total system transmission power. From the system model, there are three links in the relay channel with two SNR levels: SNR1 denotes the SNR level at the relay and SNR2 denotes the SNR level at the destination. The relay must decode the source signal at SNR1 while the destination must decode the source signal at SNR2≤SNR1 with the help of side information from the relay signal transmitted in the MAC mode. Thus the challenge of designing a coding scheme for the relay channel is how to optimize a code such that this code can optimally operate at two different SNRs or two different rates.

As discussed from the previous paragraph, the main problem of half-duplex relay coding can be reduced to the simultaneous design of two codes that operate at two different rates (or two different SNRs), such that one is a subset of the other. This problem can be addressed by forceful optimization, but two clever methods of addressing this problem are via the bilayer-expurgated (BE) and bilayer-lengthened (BL) LDPC structures. These methods use a bilayer Tanner graph to make the two codes, while using a concept of "parity forwarding" with subsequent successive decoding that removes the need to directly address the issue of uneven SNRs among the symbols of a given codeword. The methods are attractive in that they address some of the main issues in the design of relay codes, but the methods do not give rise to highly structured codes with simple encoding, nor do they provide rate-compatible codes.

A class of structured codes can be constructed that simultaneously possess a bilayer parity-forwarding mechanism, while also benefiting from the properties of protograph codes (easy encoding, modular design, and rate-compatible). Described below is a method to construct a bilayer code that is applicable to the relay channel, using different protograph-based LDPC codes. Note that the design of good protograph-based LDPC codes that may be used in this application has been discussed above.

A first method is a bilayer-lengthened approach. The bilayer lengthened code constructed for the half-duplex relay channel is shown in FIG. 13. This method consists of designing a low-rate protograph code (Layer 1) designed for the S-D channel (CSD1) and then adding a set of extra variable nodes (Layer 2) into layer 1 to form a higher rate bilayer code that is applicable for the S-R channel (CSR1). The codeword (both layers) CSR1 is broadcast from the source (see FIG. 13). In the example of this figure, Layer 1 consists of a rate-1/2 code (seen again on the right side of the figure entitled "Step 2: Decoding Layer 1" and Layer 2 consists of up to 2n variable nodes. The relay receives this code and since this overall code is designed for the S-R channel, will be able to decode it. Then the relay will generate an extra set of parity bits by using a code C1 only for Layer 2, in a manner similar to that described in P. Razaghi and W. Yu, "Bilayer low-density parity-check codes for decode-and-forward in relay channels," *IEEE Trans. Inform. Theory*, vol. 53, no. 10, pp. 3723-3739, October 2007, then the relay encodes and transmits it to the destination via a another code CRD2. The extra parity bits will be decoded at the destination via a separate code C1. Once the destination decodes this secondary code C1, its bits can be eliminated from the Tanner graph of the first code to give rise to a lower-rate code that can be directly decoded at the SNR of the S-D link. These operations are depicted in FIG. 13.

The design process for a variety of channel conditions is now very easy. Assume that the mother protograph code (the lower rate) is designed and is available. This mother code can then be used to choose the code with rate necessary to support transmission in the S-D link. This is the code demonstrated at the right side noted by "Layer 1" of FIG. 13. Another set of variable nodes are added into the graph of the mother code by considering the SNR of the S-R link. Both layers will form a bilayer code with a rate that is supported by the SNR of the S-R link as in the left side of FIG. 13. Another code (secondary code) is used at the relay to generate additional parity bits for the Layer 2, and then forward these parity bits to the destination by using another code (third code). For the secondary code, a systematic version of (another) rate-compatible protograph codebook may be used, which can be matched to the S-D channel quality.

Another method is a bilayer-expurgated approach. The bilayer expurgated code constructed for the half-duplex relay channel is showed in FIG. 14. In contrast to the bilayer-lengthened approach, the method consists of designing a high-rate code (CSR1) that is supported by the source-relay channel and then adding several check nodes into this code graph such that the overall graph (after adding these check nodes to form CSD1) has a lower rate that is supported by the source-destination channel. The codeword of the high-rate code CSR1 is broadcast from the source (FIG. 14). The relay receives this code and since this code is designed for the S-R channel, will be able to decode it. Then, the relay will generate an extra set of k2 parity bits (or equivalent check nodes in Layer 2), denoted as Layer 2 in FIG. 14. These extra parity bits are transmitted to the destination through another conventional code CRD2, designed to match with the R-D channel. Once the destination decodes CRD2 to get these extra parity bits, it will be able to decode the source codeword using the bilayer graph at a lower rate CSD1 at the SNR1 level of the S-D channel. The operations are described in FIG. 14.

Two Relay Channels

So far, the discussion above concentrates on designing a coding scheme for the one-relay channel. However, the nested code structure can be also directly applied for the multi-relay channel scenarios. To illustrate that idea, an example of designing two-relay coding scheme is discussed in the following. There are two main different protocols that can be applied to the two-relay channel scenarios. In the first case, two relays can directly decode the source signal, then two relay can cooperatively beamform additional information to the destination. This coding problem is fundamentally the same as the case of the one-relay channel. In the second case, one can assume that the channel between the first relay and the destination is weak; and one out of two relays cannot decode the source signal; however it still gets a stronger signal than that of the destination. Then it is able to cooperate with the other relay to transmit additional information to destination. The discussion below addresses the second case.

Figure 15:
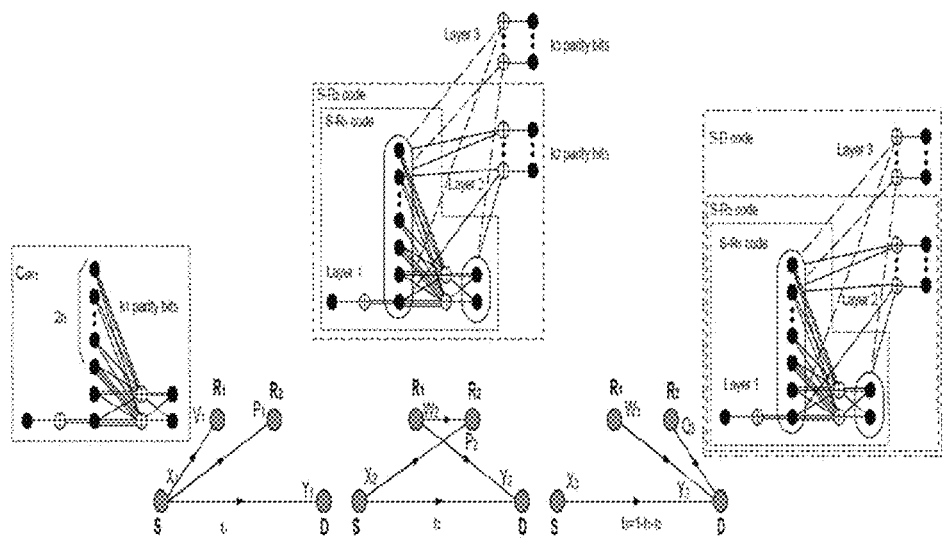
FIG. 15 shows the application of expurgating protograph design given in FIG. 9 in two-relay half-duplex channel. This can be extended to multiple relay channels.

The two-relay channel is plotted in FIG. 15 using expurgated structure design in FIG. 11. In FIG. 15, two relays $R_1$ and $R_2$ successively help to transmit the data of the source S to the destination D. The transmission time is divided into three time slots, indexed by the subscript i=1, 2 and 3. $X_i$, $W_i$ and $Q_i$ denote the transmitted signals from the source (S) and two relays ($R_1$ and $R_2$) while $Y_i$, $V_i$ and $P_i$ denote the received signals at the destination (D) and two relays respectively. In the first time-slot, the source transmits information which is received by two relays and the destination. The first relay can decode it, however the second relay and the destination are unable to decode. In the second time-slot, the source and the first relay transmit the additional information to the second relay and destination. Again, only the second relay can decode the source data, but the destination cannot. In the third time-slot, the source and two relays transmit additional information to help the destination decode the whole source codeword.

Among the two methods of constructing a bilayer code discussed herein, the bilayer lengthened structure is difficult to extend to multiple-relay scenarios because of short-block length problem. In the bilayer lengthened structure for the one-relay channel, the source codeword is split into two parts. The relay generates parity bits for one part, and transmits to the destination. Thus the bilayer lengthened code is equivalent to two short code-words that are decoded at the destination. So if multiple relays are used, the blocklength of source's codeword is split into many codewords. Because the overall codeword length is limited due to practical constraints, the many divisions mentioned above produce individual codewords that are too short to provide good performance.

The bilayer expurgated codes, on the other hand, do not have the problem of short blocklength. With one long codeword transmitted from the source, multiple relays can generate as many parity bits as the decoder needs to decode the source message.

The multi-layer expurgated code construction for the two-relay network is shown in FIG. 15. It consists of a nested bilayer or a three-layer structure that simultaneously supports three different rates, all of which are capacity approaching. The source encodes its message using the code CSR1. The first relay decodes the source's message, generates k2 parity bits using the sub-graph denoted "Layer 2", then encodes these parity bits using another conventional LDPC code C1 to send to the second relay. The second relay decodes the code C1 to get k2 parity bits and decodes the source message with the help of these k2 parity bits. Then it computes separate k3 parity bits using the subgraph denoted "Layer 3" to be encoded by another conventional LDPC code C2. The destination decodes C2, then C1, and finally the source message with the help of k2+k3 additional parity bits from two relays. The achievable rate using the above strategy is a special case of the achievable rate described in L. L. Xie and P. R. Kumar, "An achievable rate for the multiple level relay channel," IEEE Trans. Information Theory, vol. 51, no. 4, pp. 1348-1358, April 2005.

The nested bilayer expurgated structure code designed in FIG. 11 can support multiple rates. All codes are capacity approaching with the iterative decoding threshold gap within 0.3 dB to the capacity limit. The code design methodology described here can be very general, and applicable for multiple relay networks. For example, if the source uses the rate-0.75 code to encode its message, then the first relay will decode the source code at R=0.75; the second relay, with the help of k2 parity bits, can decode the source message at any rate R=0.59; then the destination, with the help of k2+k3 parity bits from two relays can decode the source message at any rate 0.5.

The examples above generally show the use of selected codes as the mother code for the derivation of a lower rate or higher rate LDPC codes. However, those skilled in the art understand that the mother codes may comprise any of several LDPC codes selected for various characteristics. Those skilled in the art also understand that the mother codes may comprise codes having rates other than those specifically used as examples above. Therefore, the disclosed and claimed invention comprises mother codes of multiple rates and multiple compositions.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. In particular it is to be understood that the disclosures are not limited to particular compositions or biological systems, which can, of course, vary. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. It is also to be understood that the terminology used herein is for the purpose of describing particular embodiments only, and is not intended to be limiting. Reference to a claim element in the singular is not intended to mean "one and only one" unless explicitly so stated. As used in this specification and the appended claims, the singular forms "a," "an," and "the" include plural referents unless the content clearly dictates otherwise. The term "several" includes two or more referents unless the content clearly dictates otherwise. Unless defined otherwise, all technical and scientific terms used herein have the same meaning as commonly understood by one of ordinary skill in the art to which the disclosure pertains.

Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A digital communication coding method, comprising:
selecting a desired rate to be implemented by a low-density parity-check (LDPC) code represented by a protograph;
selecting a number of variable nodes and a number of check nodes to be implemented in the protograph;
selecting constraints for the protograph;
searching for all possible edges in the protograph to create computed permutations of the protograph;
computing an iterative decoding threshold for each computed permutation of the protograph; and
selecting the computed permutation of the protograph with a lowest computed iterative decoding threshold to implement the LDPC code.

2. The method according to claim 1, wherein selecting constraints for the protograph comprises selecting contracts for the protograph to satisfy a linear minimum distance property.

3. The method according to claim 1, wherein at least one variable node comprises a punctured node.

4. The method according to claim 1, wherein selecting a desired rate comprises selecting a rate of 1/2 and selecting a number of variable nodes comprises selecting 7 variable nodes and selecting a number of check nodes comprises selecting 4 check nodes and wherein the protograph is represented by a proto-matrix having four rows and seven columns and selecting constraints comprises:
constraining a first column of the proto-matrix to have a degree of 1;
constraining a second column of the proto-matrix to have a degree of 2;
constraining a third column of the proto-matrix to be punctured; and
constructing a submatrix within the proto-matrix, wherein the submatrix comprises columns two through seven and rows two through four of the proto-matrix, wherein two or fewer columns in the submatrix have a degree of two and all columns in the submatrix not having a degree of two have a degree of three or greater and the maximum number of parallel edges represented in the third column of the submatrix is three and the maximum number of parallel edges represented in the remaining columns of the submatrix is two.

5. The method according to claim 4, wherein the selected computed permutation of the protograph comprises the following proto-matrix:

$$H'_{1/2} = \begin{pmatrix} 1 & 0 & 2 & 0 & 0 & 1 & 0 \\ 0 & 1 & 3 & 1 & 1 & 1 & 0 \\ 0 & 1 & 1 & 2 & 2 & 2 & 1 \\ 0 & 0 & 2 & 0 & 0 & 0 & 2 \end{pmatrix}_{4 \times 7}.$$

6. The method according to claim 1, wherein selecting a desired rate comprises selecting a higher rate based on a lower rate code implemented in a lower rate protograph having four check nodes and represented by a lower rate parity check matrix and selecting constraints for the protograph comprises constructing a higher rate parity check matrix for the selected higher rate, wherein the higher rate parity check matrix comprises the lower rate parity check matrix extended with three additional columns, wherein a first row of the three additional columns comprises edges for a check node that connects to a degree-1 variable node and rows two through four of the three additional columns comprise a subgraph, wherein sums of each column of the three additional columns within the subgraph are three or higher.

7. The method according to claim 6, wherein the edges in the subgraph are limited to two parallel edges or fewer.

8. The method according to claim 1, wherein selecting a desired rate comprises selecting a higher rate code based on a lower rate code implemented in a lower rate protograph represented by a lower rate parity check matrix and wherein selecting constraints comprises constructing a higher rate parity check matrix for the selected higher rate, wherein the higher rate parity check matrix comprises the lower rate parity check matrix extended with additional columns and wherein searching for all possible edges in the protograph comprises searching the higher rate parity check matrix and the LDPC code has a higher rate than the lower rate code.

9. The method according to claim 8, wherein in a channel having one relay, the higher rate code is selected for transmission from a source to the one relay and a destination, and wherein the lower rate code is received at the destination, and wherein codeword symbols that appear in the lower rate code but not in the higher rate code are provided by the relay to the destination.

10. A digital communication coding method for embedded rate-compatible LDPC codes, the method comprising:
selecting a higher rate code represented by a higher rate parity check matrix with a higher rate row dimension and a higher rate column dimension;
constructing a protograph represented by a lower rate parity matrix, wherein the lower rate parity matrix is created by extending the higher rate parity matrix by an equal number of added columns and added rows, wherein the added columns and added rows form three submatrices within the lower rate parity matrix, a first submatrix of the three submatrices having a location within the lower rate parity matrix defined by the added columns and the higher rate row dimension, a second submatrix of the three submatrices having a location within the lower rate submatrix defined by the added rows and a lower rate column dimension, and a third submatrix of the three submatrices having a location defined by the added columns and added rows, and wherein the first submatrix is a zero submatrix;
constraining edges in the second and third submatrix to maintain linear growth of minimum distance;
searching for all possible edges in the proto graph to create computed permutations of the protograph;
computing an iterative decoding threshold for each computed permutation of the protograph; and
selecting the computed permutation of the protograph with a lowest computed iterative decoding threshold to implement an LDPC code.

11. The method of claim 10, wherein the second submatrix comprises the following edges:
edges in a first column of the second submatrix are set equal to zero;
edges in a third column of the second submatrix comprise edges connecting to a highest degree variable node in the higher rate parity matrix; and,
edges in all other columns of the second submatrix comprise edges connecting to all other variable nodes in the higher rate parity matrix except a degree-1 node, and
wherein the third submatrix comprises a lower triangular matrix and the third submatrix comprises the following edges:
edges at the main diagonal of the third submatrix are set equal to one;
edges above the main diagonal of the third submatrix are set equal to zero; and
edges below the main diagonal comprise edges that connect new variable nodes to new check nodes provided by the added rows and the added columns.

12. The method of claim 10, wherein edges in a third column of the second submatrix are set equal to 1 or 2, edges in all other columns of the second submatrix are set equal to 0 or 1 and edges below the main diagonal of the third submatrix are set equal to 0 or 1.

13. A digital communication coding method for rate-compatible LDPC codes comprising:
selecting a first rate code represented by a first rate parity check matrix;
constructing a second rate parity check matrix by extending the first rate parity check matrix by one or more rows or one or more columns or one or more rows and columns;
selecting constraints for a protograph resulting from the second rate parity check matrix;
searching for all possible edges in the protograph to create computed permutations of the protograph;
computing an iterative decoding threshold for each computed permutation of the protograph; and
selecting the computed permutation of the protograph with a lowest computed iterative decoding threshold to implement an LDPC code, wherein the LDPC code comprises a code at a second rate.

14. The method according to claim 13, wherein selecting constraints comprises for a protograph resulting from the second rate parity check matrix comprises selecting constraints for the protograph to satisfy a linear minimum distance property.

15. The method according to claim 13, wherein the first code comprises a high rate code and wherein constructing a second rate parity check matrix comprises constructing the second rate parity check matrix by extending the first rate parity check matrix by one or more added rows and wherein the LDPC code comprises a code at a lower rate than the high rate code.

16. The method according to claim 15, wherein selecting constraints comprises for a protograph resulting from the second rate parity check matrix comprises selecting constraints for the protograph to satisfy a linear minimum distance property.

17. The method according to claim 13, wherein the first rate code comprises a low rate code and wherein constructing a second rate parity check matrix comprises constructing the second rate parity matrix by extending the first rate parity matrix by one or more added columns and wherein the LDPC code comprises a code at a higher rate than the low rate code.

18. The method according to claim 17, wherein selecting constraints comprises for a protograph resulting from the second rate parity check matrix comprises selecting constraints for the protograph to satisfy a linear minimum distance property.

19. The method according to claim 15, wherein in a channel having one relay, the high rate code comprises a high rate codeword and wherein the high rate code is selected for initial transmission from a source to the relay and a destination, and wherein the LDPC code comprises a low rate codeword received at the destination and wherein codeword symbols that appear in the low rate codeword but not in the high rate codeword are provided by the relay to the destination.

20. The method according to claim 15, wherein in a channel with multiple relays, the high rate code is selected for initial transmission from a source to the multiple relays and a destination, and wherein each relay produces and transmits codeword symbols corresponding to a difference between its received codeword and a next lower-rate codeword, and the destination receives and decodes a lowest-rate codeword.

21. A method for transmission within a half-duplex relay channel having at least one relay, the method comprising:
selecting a first LPDC code with a rate necessary to support transmission of source data from a source to a destination, wherein the first LDPC code comprising a first LDPC codeword is represented by a first protograph;
adding one or more second protograph variable nodes to the first protograph to create a second protograph, wherein the second protograph has a linear distance property and the second protograph implements a second LDPC code comprising a second LDPC codeword;
transmitting data from the source with the source data encoded with the second LDPC code;
receiving data coded with the second LDPC code at a relay;
decoding the data received at the relay to extract the second LDPC codeword;
selecting a subset of the one or more second protograph variable nodes of the second LDPC code and adding one or more relay variable and check nodes to the selected subset of the one or more second protograph variable nodes to create a third LDPC code comprising a third LDPC codeword;
encoding a combination of selected one or more second protograph variable nodes and one or more relay variable and check nodes with a fourth LDPC code comprising a fourth LDPC codeword;
transmitting from the relay the combination of selected one or more second protograph variable nodes and one or more relay variable and check nodes coded with the fourth LPDC code to the destination;
decoding data received at the destination to extract the combination of selected one or more second protograph variable nodes and one or more relay variable and check nodes coded with the fourth LDPC code;
decoding a subset of the data received at the destination that constitutes the third LDPC codeword to extract a subset of the second LDPC codeword that excludes the first LDPC codeword;
decoding a remaining part of data received at the destination with the first LDPC code to extract the first LDPC codeword; and
extracting the source data from the extracted subset of the second LDPC codeword at the destination.

22. The method according to claim 21, wherein the first LDPC code comprises a rate-1/2 code.

23. A method for transmission within a half-duplex relay channel having at least one relay, the method comprising:
selecting a first LPDC code with a rate necessary to support transmission of source data from a source to a relay, wherein the first LDPC code is represented by a first protograph;
adding one or more check nodes and adding one or more variable nodes to the first protograph to create a second protograph, wherein the second protograph has a linear distance property and the second protograph implements a second LDPC code, wherein the added one or more variable nodes correspond to the second LDPC code;
transmitting first data from the source, wherein the first data comprises the source data encoded with the first LDPC code;
receiving the first data coded with the first LDPC code at the relay;
decoding the first data received at the relay to extract the source data coded with the first LDPC code;
computing at the relay the added one or more variable nodes corresponding to the second LDPC code to provide computed one or more variable nodes;
encoding the computed one or more variable nodes with a third LDPC code;
transmitting second data comprising the computed one or more variable nodes coded with the third LDPC code to a destination and transmitting encoded source data to the destination;
decoding the second data received at the destination to extract the computed one or more variable nodes; and
decoding the encoded source data received at the destination using the computed one or more variable nodes to extract the source data from the encoded source data received at the destination.

24. The method according to claim 23, wherein the first LDPC code comprises a rate-1/2 code.

25. A method for transmission within a half-duplex relay channel having two or more relays, the method comprising:
selecting a first LPDC code with a rate necessary to support transmission of source data from a source to a first relay, wherein the first LDPC code is represented by a first protograph;
adding one or more check and variable nodes to the first protograph to create a second protograph, wherein the second protograph has a linear distance property and the second protograph implements a second LDPC code;
adding one or more check and variable nodes to the second protograph to create a third protograph, wherein the third protograph has a linear distance property and the third protograph implements a third LDPC code;
transmitting first data from the source with the source data encoded with the first LDPC code;

receiving the first data coded with the first LDPC code at a first relay;

decoding the first data received at the first relay to extract the source data coded with the first LDPC code;

computing at the first relay, one or more added first relay variable nodes to produce a first LDPC codeword;

encoding the one or more added first relay variable nodes with a fourth LDPC code;

transmitting second data comprising the one or more added first relay variable nodes coded with the fourth LPDC code to a second relay and transmitting additional data contained the first LDPC codeword;

decoding the second data received at the second relay to extract the one or more added first relay variable nodes coded with the fourth LDPC code;

decoding the additional data received at the second relay using the extracted one or more added first relay variable nodes to extract the first LDPC codeword from the additional data received at the second relay;

computing at the second relay, one or more added second relay variable nodes to produce a second LDPC codeword;

encoding the one or more added second relay variable nodes with the third LDPC code;

transmitting the third LDPC code from the second relay to a destination;

decoding the third LDPC code at the destination to extract the one or more added second relay variable nodes;

decoding the fourth LDPC code at the destination to extract the one or more added first relay variable nodes; and decoding a destination message using the one or more added first relay variable nodes and the one or more added second relay variable nodes to extract the source data.

26. The method according to claim 25, wherein the first LDPC code comprises a rate-0.75 code.

27. The method according to claim 25, wherein the half-duplex relay channel comprises at least three relays and each subsequent relay after the first relay and the second relay computes additional variable nodes to form additional LDPC codewords.

* * * * *